United States Patent [19]

Tanigami et al.

[11] Patent Number: 5,742,541
[45] Date of Patent: Apr. 21, 1998

[54] WRITING METHOD FOR NONVOLATILE SEMICONDUCTOR MEMORY WITH SOFT-WRITE REPAIR FOR OVER-ERASED CELLS

[75] Inventors: Takuji Tanigami; Shinichi Sato, both of Nara, Japan

[73] Assignee: Sharp Kabushiki Kaisha, Osaka, Japan

[21] Appl. No.: 580,515

[22] Filed: Dec. 28, 1995

[30] Foreign Application Priority Data

Mar. 24, 1995 [JP] Japan ................... 7-066384

[51] Int. Cl.⁶ .................................. G11C 16/04
[52] U.S. Cl. ...................... 365/185.3; 365/185.12; 365/185.18; 365/185.24; 365/185.26; 365/185.27
[58] Field of Search ................ 365/185.12, 185.27, 365/185.18, 185.26, 182.24

[56] References Cited

U.S. PATENT DOCUMENTS

| | | | |
|---|---|---|---|
| 4,882,707 | 11/1989 | Mizutani | 365/185.15 |
| 5,293,560 | 3/1994 | Harari | 365/185.3 |
| 5,359,558 | 10/1994 | Chang et al. | 365/185.3 |
| 5,504,708 | 4/1996 | Santin et al. | 365/185.27 |
| 5,553,020 | 9/1996 | Keeney et al. | 365/185.27 |
| 5,568,419 | 10/1996 | Atsumi et al. | 365/185.3 |
| 5,576,992 | 11/1996 | Mehrad | 365/185.3 |
| 5,596,528 | 1/1997 | Kaya et al. | 365/185.27 |

FOREIGN PATENT DOCUMENTS 6-204491  7/1994  Japan .

OTHER PUBLICATIONS

Flash Memory Technology Handbook edited by Fujio Masuka.

"International Electron Devices Meeting 1991" A Self-Convergence Erasing Scheme For a Simple Stacked Gate Flash EEPROM, Seiji Yamada et al, pp. 307–310.

"International Electron Devices Meeting 1994" A Novel Band–To–Band Tunneling Induced Convergence Mechanism For Low Current, High Density Flash EEPROM Applications, Danny P. Shum et al, pp. 41–43.

Primary Examiner—Joseph E. Clawson, Jr.
Attorney, Agent, or Firm—Nixon & Vanderhye P.C.

[57] ABSTRACT

A non-volatile semiconductor memory includes a plurality of memory cells. Each memory cell includes N-type source and drain regions formed in a P-well on a semiconductor substrate, a floating gate formed on the P-well with a tunnel oxide film therebetween, and a control gate formed on the floating gate with an interpoly dielectric film therebetween. The memory has a plurality of bit lines, a plurality of word lines and a source line. The source region of each memory cell is connected to the source line. The drain region of each memory cell is connected to one of the word lines. The memory cell is written to, erased, or read by selectively supplying suitable voltages to the source, bit, and word lines connected thereto. When a selected memory cell is written to by injection electrons into its floating gate, (1) a negative voltage is applied to the P-well and the source line, (2) a first positive voltage is applied to the selected bit line, (3) a second positive voltage is applied to the selected word line, and (4) 0V is applied to the non-selected word line. The second positive voltage applied to the control gate is lower than a predetermined voltage between the source and the control gate.

8 Claims, 15 Drawing Sheets

(Voltages applied when Vpw = 0V)

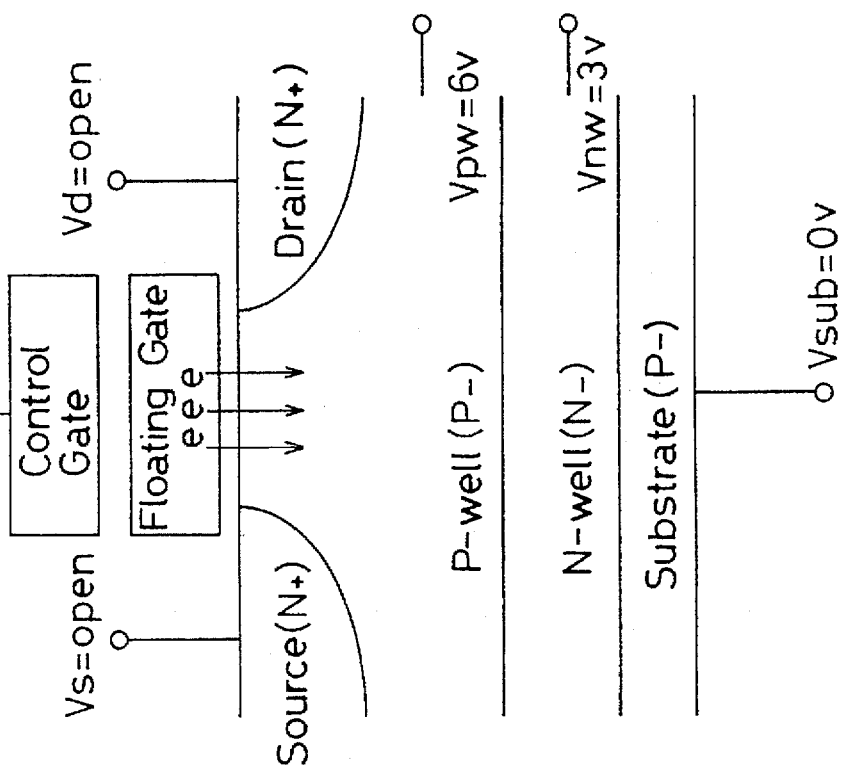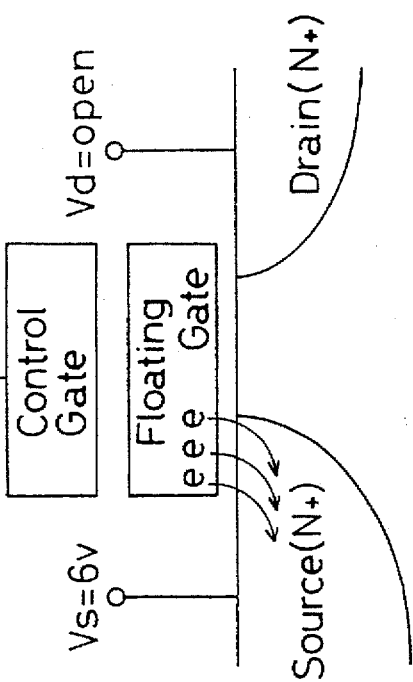

Fig. 5

|  | Selected WL | Non-selected WL | Selected BL | Non-selected BL | SL | PW |
|---|---|---|---|---|---|---|
| Reading | 5 | 0 | 1 | open | 0 | 0 |
| Writing | 10 | 0 | 3 | open | -2 | -2 |
| Source-gate Erasing | -10 | 0 | open | open | 6 | 0 |
| Substrate Erasing | -10 | 0 | open | open | open | 6 |

(In substrate erasing, NW must be fixed at 0V or 3V)

The numbers in the table represent voltages.

(Cell with a threshold over Vthmax(3V))

(Over-erased Cell)

Voltages applied when Vpw=0V

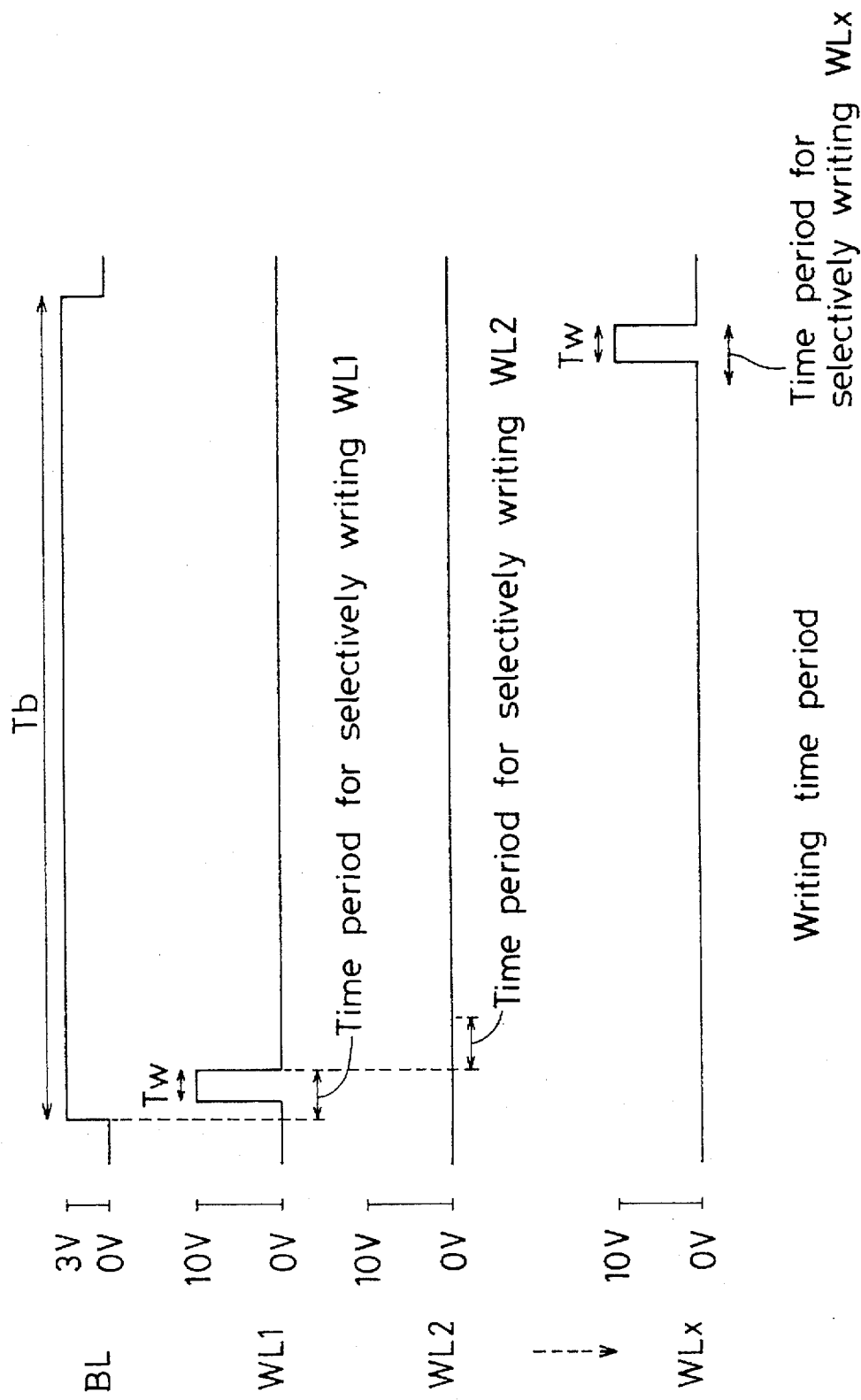

Source-gate Erasing

Source Erasing

Substrate Erasing

Fig. 17  Prior Art

|  | Selected WL | Non-selected WL | Selected BL | Non-selected BL | SL | Substrate |
|---|---|---|---|---|---|---|
| Reading | 5 | 0 | 1 | open | 0 | 0 |
| Writing | 12 | 0 | 5 | open | 0 | 0 |
| Source-gate Erasing | -12 | 0 | open | open | 6 | 0 |
| Source Erasing | 0 | 0 | open | open | 12 | 0 |
| Substrate Erasing | -18 | 0 | open | open | open | 0 |

The numbers in the table represent voltages.

Fig. 19  Prior Art

|  | Selected WL | Non-selected WL | Selected BL | Non-selected BL | SL | Substrate |
|---|---|---|---|---|---|---|
| Reading | -8 | 0 | 6 | 0 | open | 0 |
| First Erasing | 18 | 0 | 0 | 0 | 0 | — |
| Second Erasing | 8 | 0 | -10 | -10 | -10 | -10 |
| Third Erasing | 12 | 0 | 0 | 5 | 5 | — |

The numbers in the table represent voltages

WRITING METHOD FOR NONVOLATILE SEMICONDUCTOR MEMORY WITH SOFT-WRITE REPAIR FOR OVER-ERASED CELLS

BACKGROUND OF THE INVENTION

1. Field of the Invention

The present invention relates to methods for writing in a nonvolatile semiconductor memory, particularly a nonvolatile semiconductor memory capable of being electrically rewritten such as a flash memory with floating gates.

2. Description of the Related Art

In recent years, among EEPROMs (Electrically Erasable Programmable Read Only Memory), a nonvolatile semiconductor memory called a flash memory has been attracting considerable attention and a mass memory system thereby has been developed.

For example, a conventional flash memory is described in Flash Memory Technology Handbook edited by Fujio Masuoka (referred to as reference 1 hereafter).

In general a nonvolatile semiconductor memory operating an electrical writing and erasing of data (a flash memory) is constituted of memory cells in each of which a source and drain layers are formed on a first conductivitytype semiconductor substrate, and a tunnel oxide film, a floating gate electrode, a interpoly dielectric film of three-layered oxide-nitride-oxide film so as to cover the floating gate and a control gate electrode are mounted in this order on the substrate; and peripheral circuits such as a decoder supplying voltage for the memory cells.

FIG. 11 is a sectional view illustrating the construction of the nonvolatile semiconductor memory of the reference 1. As shown in FIG. 11, a tunnel oxide film 112 sufficiently thin for an electric erasure (about 10 nm) is formed on a P-type semiconductor substrate 111 (impurity concentration: $1 \times 10^{15}$ to $1 \times 10^{16}$ cm$^{-3}$) by thermal oxidation and a polycrystalline silicon film (100 to 200 nm) doped with phosphorus impurity is formed as an electrode of a floating gate 113 on the tunnel oxide film. Covering the floating gate 113, an ONO film (three-layered film of silicon oxide film $SiO_2$/silicon nitride film SiN/silicon oxide film $SiO_2$) is formed as an interpoly dielectric film 115 and a polycrystalline silicon film (100 to 200 nm) is formed as an electrode of a control gate 115 on the ONO film. A source 116 and drain 117 layers are formed in self-alignment with the electrodes of the gates 113 and 115.

Methods for writing and erasing of the above memory cell of the reference 1 will be described hereafter.

FIG. 12 illustrates the method for writing the memory cell of the reference 1 and FIGS. 13A to 13C illustrate three different methods for erasing the memory cell of the reference 1. The method shown in FIG. 13A is called a source-drain erasing, the method shown in FIG. 13B a source erasing and the method shown in FIG. 13C a substrate erasing.

In the flash memory as described in the conventional reference 1, a channel hot electron injection (referred to as "CHE injection" hereafter) is used in writing and the Fowler-Nordheim tunnel current (tunnel current according to the formula of Fowler-Nordheim; referred to as "F-N tunnel current" hereafter) is used in erasing. A potential difference of 12 V or more is necessary for writing and erasing. FIG. 14 is a schematic view showing voltages applied to the memory cell of the reference 1. In FIG. 14, the reference characters Vcg, Vd, Vs and Vsub denote voltages applied to the control gate, the drain, the source and the substrate respectively. The control gate, drain, source and substrate are supplied with voltages in a writing, erasing and reading operations of the memory cell. The numerals in parentheses denote voltages applied in writing.

FIG. 15 is a circuit diagram illustrating the writing operation of the memory cell array of the reference 1 and FIG. 16 is a circuit diagram illustrating the erasing operation.

In FIGS. 15 and 16, the reference characters Tr11, Tr12, Tr21 and Tr22 denote memory cells having floating gates, WL1 and WL2 denote word lines connected to the control gates of the memory cells, BL1 and BL2 denote bit lines connected to the drains of the memory cells and SL denote a source line connected to the sources of the memory cells.

The word line WL1 is connected to the control gates of Tr11 and Tr12 and the word line WL2 to the control gates of Tr21 and Tr22. The bit line BL1 is connected to the drains of Tr11 and Tr21 and the bit line BL2 to the drains of Tr12 and Tr22. The source line SL is connected to the sources of Tr11, Tr12, Tr21 and Tr22.

In FIGS. 15 and 16, the word line WL1 and the bit line BL1 are voltage supply lines in a selected state and the word line WL2 and the bit line BL2 are voltage supply lines in a non-selected state. FIG. 15 shows a state in which Tr11 is selected and written and FIG. 16 a state in which Tr11 and Tr12 are selected and erased by the source-gate erasing method.

FIG. 17 is a table showing the voltages applied to the respective sections of the memory cell array of the reference 1 in the writing, erasing and reading operations.

Referring to FIGS. 15 and 17, the writing operation in the reference 1 will be described. Tr11 is electrically written with electrons injected into the floating gate by using CHE injection by applying 12 V to the control gate, Vcg1=12 V, grounding the source and the substrate (Vs=Vsub=0 V) and applying 5 V to the drain, Vd1=5 V.

Usually, the voltages Vcg1 and Vd1 are not applied at the same time; first the word line WL1 is selected and Vcg1=12 V is applied to WL1; while Vcg1=12 V is kept applied to WL1, a pulse "0" or "1" (e.g. 0 V or 5 V) is applied to the bit line BL1 for writing.

In Tr12 and Tr21, the high voltage is applied to either the drains or the control gates, so that no electrons are injected into the floating gates. Therefore the writing cannot be accomplished. Of course in Tr22, since the high voltage is not applied to either the drain or the control gate, the writing cannot be done.

Next referring to FIGS. 16 and 17, the source-gate erasing method (the negative bias method) described on pages 76 to 77 of the reference 1 will be explained.

As shown in FIG. 17, Tr11 and Tr12 are erased by drawing electrons from the floating gates by using tunnel currents which flow through the thin oxide films at the overlap areas between the source diffusion layers and the floating gates generated by applying a negative voltage of −12 V to the control gates, Vcg1=−12 V, and a positive voltage of 6 V to the source, Vs=6 V (see FIG. 13A).

In Tr21 and Tr22, voltage being applied only to the sources, no potential differences sufficient to induce F-N tunnel currents are generated between the sources and the control gates. Therefore no electrons are drawn from the floating gates and the erasing is not accomplished.

Besides the above described source-gate erasing method, the source erasing and substrate erasing (the channel erasing) methods are also described in the reference 1. FIGS.

13B and 13C explaining the source erasing and substrate erasing methods respectively show that electrons are drawn from the floating gate by use of the tunnel current in both the erasing methods.

Judging form the voltages applied to each of the sections in the erasing operation as shown in FIGS. 13B, 13C and 17, the source erasing and source-gate erasing methods are more suitable than the substrate erasing method for reducing the voltage applied to the control gate. In the source erasing, however, hot holes generated by a band-toband tunneling are injected into the tunnel film and therefore the number of repeated rewriting times is limited to 10,000 to 100,000 times. Thus the source-gate erasing (the negative gate bias method) is the most suitable.

Also for simplifying a peripheral circuit such as a decoder supplying the voltage to the memory cell, as expected in the art, the reduction of the voltage applied in the writing operation is required.

Another conventional method of rewriting a nonvolatile semiconductor memory is proposed in Japanese Unexamined Patent Publication HEI 6(1994)-204491 (referred to as reference 2 hereafter).

FIG. 18 is a sectional view illustrating the construction of the nonvolatile semiconductor memory of the reference 2. Referring to FIG. 18, a P-type second well 183 is formed in an N-type first well 182 on a P-type semiconductor substrate 181; a tunnel oxide film 184, an electrode of a floating gate 185, an interpoly dielectric film 186 of three-layered oxide-nitride-oxide film so as to cover the floating gate and an electrode of a control gate 187 are mounted on the P-type second well 183 in this order and a source 188 and drain 189 are formed in self-alignment with the electrodes of the gates 185 and 187.

Both writing and erasing of the memory cell of the reference 2 are operated by using the F-N tunnel current. The writing and erasing modes being opposite to those in the reference 1, the floating gate is discharged of electrons in the writing operation and injected with electrons in the erasing operation.

FIG. 19 is a table showing voltages applied to each section of the memory cell array of the reference 2 in the writing, erasing and reading operations. In FIG. 19, the word line WL is connected to the electrode of the control gate. Bit line BL is connected to the electrode, of the drain. The reference character SL denotes the source line.

The writing of the memory cell of the reference 2 is operated by drawing electrons from the floating gate; "0" or "1" is written by applying a pulse, for example "0 V" or "6 V", to the bit line BL1 while −8 V and 0 V are applied to Vcg and Vsub respectively and Vs is kept open. This enables the writing and reading to be operated with the same voltage.

The erasing of the memory cell of the reference 2 is operated by injecting electrons into the floating gate, for example, by applying Vcg=8 V to the control gate 187 while a negative voltage of −10 V is kept applied to the substrate 181 and the P-type well Vp=−10 V. This is designed to reduce the voltage applied to the control gate 187.

In recent years, as the design rule for memory cells has been microminiaturized to less than 0.4 um, a peripheral circuit has also been required to be microminiaturized and the voltages applied to the control gate in the writing and erasing operations are highly anticipated to be lowered.

However, in the memory cell of the reference 1, Vcg=12 V must be applied to the control gate in the writing (by using CHE) and Vcg=−12 V must be applied to the control gate in the erasing by the source-gate erasing method (the negative gate bias method). Therefore a gate oxide film of a peripheral circuit need to be 180 Å or more in thickness and the peripheral circuit is designed under the 0.8 um design rule.

At present, when the F-N tunnel current is used for erasing, the voltage Vcg applied to the control gate can be lowered by using thinner films for the tunnel oxide and the ONO film (in the negative gate bias method, lower than −10 V), but it is difficult to reduce the voltage applied to the control gate for writing.

On the other hand, the nonvolatile semiconductor memory of the reference 2, namely Japanese Unexamined Patent Publication HEI6(1994)-204491, is constructed so that Vcg in the writing operation can be −8 V and Vcg in the erasing operation can be +8 V in order to allow the reduction of the voltage applied to the control gate. The usage of F-N tunnel current for writing, however, disadvantageously prolongs the writing time for a cell.

Another drawback is an occurrence of a deeply depressed cell by over-erasing phenomenon when the memory cells are erased (see reference 1, pages 108 to 109). A memory cell over-erased or deeply depressed means that the threshold (Vth) of the floating gate thereof is negative.

FIG. 20 explains a misreading of the memory cell of the reference 1. As shown in FIG. 20, in order to read a selected cell, a positive voltage Vd is applied to the bit line connected to the drain thereof and a positive voltage Vcc is applied to the word line connected to the control gate thereof. A drain current does not flow when the selected cell is written (Vth being high) and the drain current flows when the selected cell is not written (Vth being low). The reading is thus operated.

As FIG. 20 shows, however, if a deeply depressed cell (referred to as an over-erased cell hereafter) which is not selected lies on the selected bit line, the current flows through the over-erased cell from the bit line even though the selected cell in which a voltage Vcc=5 V is applied to the control gate, is written (Vth being high). Thus the selected cell is misread as if it were not written (as if Vth were low).

Therefore the threshold voltage (Vth) of the erased cell must be 0 V or more. On the other hand, when an unwritten cell (Vth being low) is selected, the current needs to flow through the cell, which means that the threshold voltage of the cell Vth must be lower than Vcc. Considering a margin sufficient for securing an enough current for the reading, the threshold must usually be within a range from about 0.5 V to 3 V when Vcc is 5 V.

Such an over-erased cell results from irregularity in the F-N tunnel current due to inequality in the tunnel oxide from cell to cell, irregular extension of the lengths of the gates, the width of channel or the source diffusion layer which determine the coupling ratio of the cell, and difference in the voltage due to unequal thickness of a film such as an ONO film, each of which causes a difference in the threshold voltage of the cell after being erased.

Because of difficulty in having perfect control over these differences, an additional operation is conventionally required such as rewriting the over-erased cell (with Vth<0) into a normally erased cell (Vth>0).

For the rewriting operation, additional steps should be taken to seek an over-erased cell and repair the Vth thereof (0.5 V<Vth<3 V) after the normal writing and therefore an additional peripheral circuit for the steps is required, which brings about other problems such as a large-sized device and a complicated peripheral circuit.

The art is now seeking a reduction of the employed voltage and a miniaturization of device, the mainstream changing from the conventional 5 V-type power supply voltage to the 3 V-type. In the 5 V-type power supply voltage system the Vcc (5 V) is directly used for the drain voltage Vd, while in the 3 V-type power supply voltage system a voltage (5 V) obtained by stepping up the supplied voltage of 3 V is used for the drain voltage Vd.

In the conventional memory cell technology, therefore, there is a problem that two step-up transformer circuits are necessary for supplying the voltage to the control gate in the writing and the voltage Vd (5 V) to the drain when 3 V type power supply system is used.

SUMMARY OF THE INVENTION

The present invention, in view of the above-mentioned problems, is to provide a writing method for a nonvolatile semiconductor memory which allows a microminiaturization of a peripheral circuit, a reduction of the area for a chip and a reduction of production costs per chip by keeping the voltage difference of Vcg (the difference between the voltage applied to the control gate of a cell selected to be written and that applied to the control gate of a cell selected to be unwritten) lower than the voltage between the source and the control gate necessary for writing by applying negative voltages to the P-well and the source of a memory cell.

Thus, the present invention provides a writing method for a nonvolatile semiconductor memory which comprises; a plurality of memory cells each of which is provided with a pair of a source and a drain which are N-type regions formed in a P-well on a semiconductor substrate, with a floating gate formed on the P-well with a tunnel oxide film therebetween, and with a control gate formed on the floating gate with an interpoly dielectric film therebetween; a plurality of bit lines, a plurality of word lines and a source line, the source of each memory cell being connected to the source line, the drain of each memory cell to one of the bit lines, the control gate of each memory cell to one of the word lines, the memory cell being written, erased or read by supplying selectively suitable voltages to the source, bit and word lines connected thereto;

wherein, when a selected memory cell is written by injecting electrons into the floating gate thereof by channel hot electron method, a negative voltage is applied to the P-well and the source line, a first positive voltage to the selected bit line, a second positive voltage to the selected word line and 0 V to the non-selected word line, thus the second positive voltage applied to the control gate being lower than a predetermined voltage between the source and the control gate.

Another purpose of the present invention is to provide a writing method for a nonvolatile semiconductor memory which allows the operational time for rewriting the over-erased cell (recovering Vth) to be shortened and the peripheral circuit to be simplified by utilizing a later-described weak writing operation for the over-erased cell at the same time of writing memory cells on a selected bit line.

Still another purpose of the present invention is to provide a writing method for a nonvolatile semiconductor memory in which no step-up transformer circuit is necessary for generating the voltage applied to the bit line and thus complexity in the peripheral circuits can be avoided.

BRIEF DESCRIPTION OF THE DRAWINGS

The accompanying drawings are as follows;

FIGS. 4A and 4B illustrate the principle for erasing a memory cell in accordance with the present invention;

FIG. 5 is a table explaining a voltage applied to each section in a writing, erasing and reading operations of a memory cell in accordance with the present invention;

FIG. 10 is a time chart showing voltages applied when a bit line is selected in accordance with the present invention;

FIG. 17 is a table explaining a voltage applied to each section in the writing, erasing and reading operations of a memory cell in accordance with the conventional reference 1;

FIG. 19 is a table explaining a voltage applied to each section in a writing, erasing and reading operations of a memory cell in accordance with the conventional reference 2.

DESCRIPTION OF THE PREFERRED EMBODIMENTS

Figure 1:
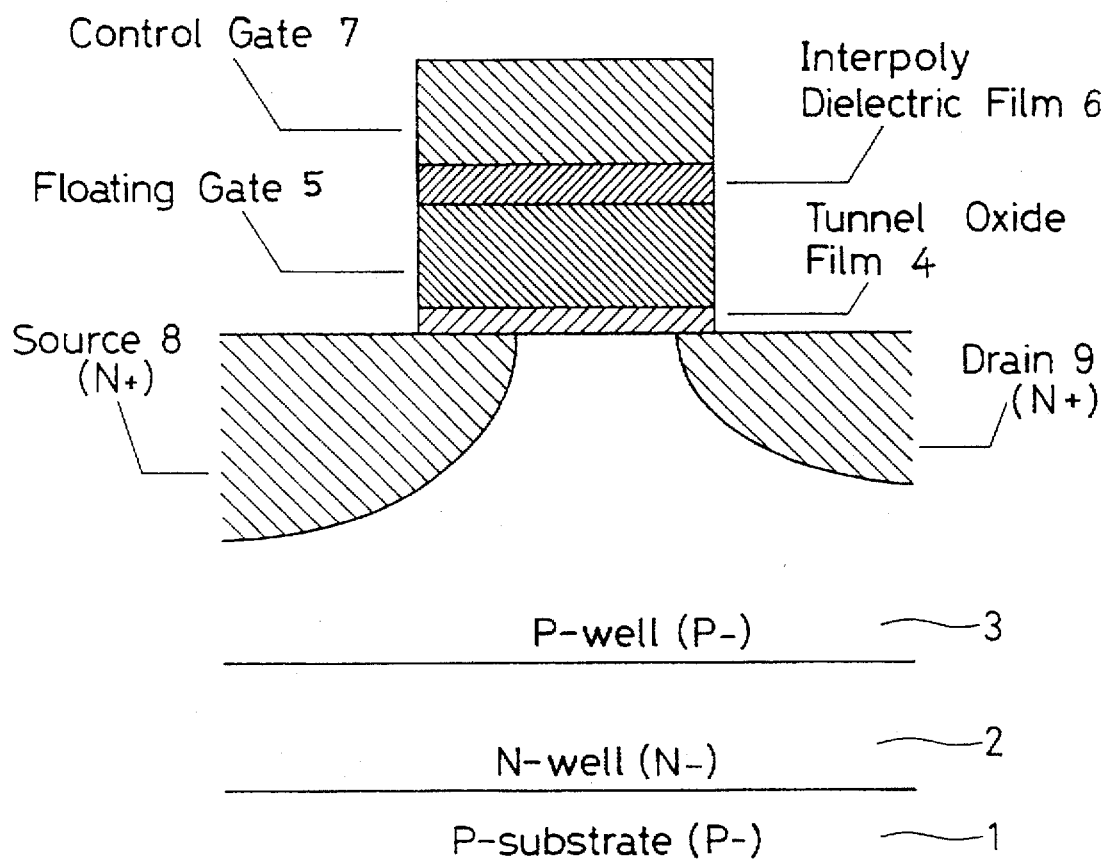
FIG. 1 is a sectional view illustrating a construction of a nonvolatile semiconductor memory in accordance with the present invention.

In a preferred embodiment, the present invention provides a writing method for a nonvolatile semiconductor memory which comprises; a plurality of memory cells each of which is provided with a pair of a source and a drain which are N-type regions formed in a P-well on a semiconductor substrate, with a floating gate formed on the P-well with a tunnel oxide film therebetween, and with a control gate formed on the floating gate with an interpoly dielectric film therebetween; a plurality of bit lines, a plurality of word lines and a source line, the source of each memory cell being connected to the source line, the drain of each memory cell to one of the bit lines, the control gate of each memory cell to one of the word lines, the memory cell being selectively written, erased and read by supplying a suitable voltage via the connected lines;

wherein, when a selected memory cell is written by injecting electrons into the floating gate thereof by channel hot electron method, a negative voltage (−2 V) is applied to the P-well and the source line, a first positive voltage (+3 V) to the selected bit line, a second positive voltage (+10 V) to the selected word line and 0 V to the non-selected word line, thus the second positive voltage applied to the control gate being lower than a predetermined voltage between the source and the control gate.

The P-type well is formed in an N-type well which is formed on the P-type semiconductor substrate and on the Ptype well the memory cell is formed.

In a memory cell selected to be written, the negative voltage is applied to the source (Vs) thereof as well as the P-type well (Vpw), e.g. Vpw=Vs=about −2 V, the first positive voltage is applied to the drain connected to the bit line, e.g. Vd=3 V, and the second positive voltage is applied to the control gate connected to the word line, e.g. Vcg=10 V, thus the memory cell being written due to the injection of electrons into the floating gate by CHE injection.

Relations between the voltages applied here are equivalent to those in the conventional method, and the writing is operated substantially in the same way as in the conventional method. However, the reduction of the voltage is achieved by the negative voltage applied to the P-type well and the source of memory cell (0 V to 10 V) compared with the voltage difference (0 V to 12 V) of the word line in the conventional writing.

Therefore, the peripheral circuits can be more microminiaturized, the chip area can be smaller and the production costs per chip can be reduced.

The present invention is preferably constructed in such a way that in the writing operation the first positive voltage applied to the bit line connected to the selected memory cell is lower than the power supply voltage applied to the device.

This construction does not need a step-up transformer circuit any longer for supplying the voltage for the drain: For example, when the power supply voltage is 3 V, the application of a negative voltage of about −2 V to the P-type well and the source, Vs=Vpw=−2 V, reduces the voltage to the drain Vd to about 3 V while the potential difference between the source and the drain in the writing operation remains about 5 V, which means the drain can be directly supplied with the supply voltage without transforming up the supply voltage; whereas, when a voltage of 0 V to −2 V is applied to the P-type well and the source, a step-up transformer circuit for supplying the drain voltage is required in addition to a step-up transformer circuit for supplying the voltage for the control gate in the writing operation and a generating circuit for supplying negative voltage.

The invention is preferably constructed in such a way that, when a selected memory cell is written by injecting electrons into the floating gate by CHE injection method, the negative voltage (−2 V) is applied to the P-type well and the source line, the first positive voltage (3 V) to the selected bit line, the second positive voltage (10 V) to the selected word line, the non-selected bit line is kept open and 0 V is applied to the non-selected word line, thus an over-erased cell which is not written on the selected bit line being repaired by weak writing.

The invention is preferably constructed in such a way that the absolute value of the negative voltage applied to the P-type well and source is lower than that of the maximum threshold voltage of the memory cell in an erased state.

In this construction, for example when a negative voltage of about −2 V is applied to the P-type well and the source, Vpw=Vs=about −2 V, the first positive voltage to the drain connected to the selected bit line, e.g. Vd=3 V, and 0 V to the non-selected control gate, Vcg=0 V in the writing operation, a cell whose threshold voltage Vth is lower than 2 V is weakly written due to a channel formed by a positive voltage Vcg (a voltage of 2 V equivalent to Vpw =Vs) substantially applied to the control gates. Thus, when a non-selected over-erased cell (Vth<0 V) lies on the selected bit line, the over-erased cell is rewritten to have Vth over 0 V.

Further since the channel is not formed and the rewriting never occurs in a cell whose threshold voltage Vth is over 2 V, a normally erased cell is never mis-rewritten so as to have a threshold voltage of higher than Vthmax (3 V) (Vthmax being the maximum value possible for a threshold voltage Vth in the erased memory cell).

In order to achieve the above purpose, the present invention preferably has such a construction that an nchannel MOS memory cell array is formed with the floating gate thereof disposed in the P-well on the semiconductor substrate.

Further the voltage applied to the control gate of a cell selected to be written, that is, the voltage supplied for the bit line connected to the control gate, (e.g. 12 V), is reduced by aV (12 V−aV) by applying a negative voltage of −aV(a>0) to the P-type well and the source by means of CHE injection as a writing method in which electrons are injected into the floating gate.

The negative voltage −aV is generated by a peripheral circuit for generating a negative voltage applied to the control gate or the substrate in the erasing (when electrons are drawn from the floating gate), so that no additional circuit is required.

Further the first positive voltage which is applied to the bit line connected to the drain of the selected memory cell in the writing operation is below the power supply voltage (e.g. 5 V) applied to the device, for example 5 V−aV.

At this stage, the threshold of the over-erased cell (Vth<0) can be recovered to positive (Vth>0) through a weak writing of the cell by applying 0 V to the control gates of the non-selected cells (Vcg=0 V).

The weak writing here is referred to as the recovery of the over-erased cell whose threshold voltage is below 0 V (Vth<0) into a normally erased cell whose threshold voltage is over 0 V (Vth>0) when "0" is written by applying 0 V to the control gate. That is, "0" is written in the overerased cell.

Further in order to recover the threshold of the overerased cell (Vth<0) within a desired range (0.5 V<Vth<Vthmax), the absolute value of the voltage "a" to the above P-well and the source is below Vthmax (a<Vthmax).

The method will be hereafter described for recovering the threshold voltages of the over-erased cells (Vth<0) on the selected bit line within a desired range (0.5 V<Vth<Vthmax) at the same time as the writing of the cell on the bit line.

As described in the explanation of the conventional references, in an ordinary selective writing method, the writing of "0" or "1" is operated by giving a pulse of "0 V" or "10 V" to the bit line BL connected to the drain while Vcg (10 V in the present invention) is applied to the selected word line WL connected to the control gate.

However, in the ordinary method, the time during which Vd (3 V in the present invention) is applied to the selected bit line BL in the writing operation (the number of the times of the pulse), depending on the number of cells to be written on the selected bit line, varies on every bit line. Therefore the time during which the voltage is applied for the rewriting operation varies. Thus there is a possibility that some of the over-erased cells may not be sufficiently rewritten and the threshold voltages thereof cannot recover the desired range.

To cope with this drawback, the present invention uses a writing method wherein a bit line is selected and then while 3 V is applied to the selected bit line, a pulse of "0 V" or "10 V" is applied to the word line WL.

Also in the present method, 3 V is kept applied to the selected bit line during the writing operation, which means that the time for applying Vd to the selected BL is about twice as long as the time in an ordinary method wherein the pulse is applied to a bit line after a word line WL is selected. Thus the voltage for the rewriting is also kept applied for a longer time.

Therefore, compared with the conventional way, the present invention has a merit of completing the rewriting for a shorter period of time (about half).

The method in view of the above will be hereafter explained. First a negative voltage −aV (−2 V) is applied to the above P-type well and the source, the first positive voltage (3 V) is applied to the selected bit line and the non-selected bit lines are kept open. With this state kept, sufficient time is secured for applying the second positive voltage (10 V) to operate each of the word lines.

Then the second positive voltage (10 V) is applied to the selected word line for an appropriate time and 0 V is kept applied to the non-selected word lines.

By setting the negative voltage applied to the P-well and the source about −2 V, Vpw=Vs=−2 V (a=2), the power supply voltage of 3 V can be directly applied to the drain without the step-up while at the same time the potential difference of about 5 V is kept between the source and the drain in the writing operation.

Next it will be hereafter explained how the rewriting operation of the over-erased cell can be completed at the same time as the writing of a plurality of memory cells (a memory cell array).

As described above, the negative voltage of about −2 V is applied to the P-well and the source, Vpw=Vs=−2 V, the positive voltage (about 3 V) is applied to the bit line BL selected to be written, Vd=about 3 V, and the non-selected bit line is kept open.

A positive voltage of either 10 V or 0 V is then applied to a word line. "1" is written by applying 10 V and "0" is written by applying 0 V. While 10 V is applied to the selected cell via the selected word line WL, 0 V is applied to the non-selected word line WL.

Thus, a weak writing is accomplished due to a channel formed only in a cell whose threshold voltage Vth is lower than 2 V in the memory cells selected by the bit line BL to which the positive voltage (about 3 V) is applied and the word line WL to which 0 V is applied.

By selecting word lines in turn, the cells on the selected bit line are selected in turn. Thus a cell on the bit line is kept in the state in which 0 V is applied to the control gate, Vcg=0 V, −2 V is applied to the P-type well and the source, Vpw=Vs=−2 V, and 3 V is applied to the drain, Vd=3 V, only when the bit line is selected for the writing operation and the cell is not selected. And in this state a cell whose threshold voltage is lower than 2 V, Vth<2 V, is weakly written due to the generated channel. Then the similar operation is repeated on a bit line selected next.

As described above, the over-erased cell gradually turns into a normally erased state as time passes. Therefore while x cells on the selected bit line (ordinarily 512 bit to 2 Kbit) are written, the over-erased cells are simultaneously rewritten and thus the threshold voltages of the over-erased cells (Vth<0 V) are recovered within a given range.

These and other objects of the present invention will become more readily apparent from the detailed description given hereinafter. However, it should be understood that the detailed description and specific examples, while indicating a preferred embodiment of the invention, are given by way of illustration only, since various changes and modifications within the spirit and scope of the invention will become apparent to those skilled in the art from this detailed description. The nonvolatile semiconductor memory of the present invention is mainly applied to a low-voltage flash memory used as an alternative for a floppy disk for portable tool use.

FIG. 1 is a sectional view illustrating the construction of the nonvolatile semiconductor memory of the present invention. Referring to FIG. 1, the construction of a nonvolatile semiconductor memory will be hereafter described, wherein a plurality of memory cells each having a floating and control gate electrodes are arranged in a Ptype well (P-well) in an N-type well (N-well) formed on a P-type semiconductor substrate (P-substrate).

The nonvolatile semiconductor has a dual-well structure in which a P-well 3 is formed in an N-well 2 in a memory cell forming region on a P-substrate 1 (substrate). The P-well 3 is about 1,000 to 3,000 nm deep from the surface of the P-substrate 1 and the N-well 2 is about 1,000 to 2,000 nm deep from the bottom of the P-well 3. The impurity concentration of the P-substrate 1 is about $1 \times 10^{15}$ to $1 \times 10^{16}$ cm$^{-3}$, that of the N-well 2 is about $1 \times 10^{16}$ to $1 \times 10^{18}$ cm$^{-3}$ and that of the P-well 3 is about $1 \times 10^{16}$ to $1 \times 10^{18}$ cm$^{-3}$.

A P-well may be formed in an N-type semiconductor substrate and also a P-well may be formed so as to be electrically separated form other areas.

A tunnel oxide film 4 whose thickness allows electrical erasing is formed on the P-well 3 by thermal oxidation. On the tunnel oxide film 4, a polycrystalline silicon film (100 to 200 nm) with phosphorus doped as impurity is formed as an electrode of a floating gate 5. An interpoly dielectric film 6 made of ONO film (silicon ,oxide film, SiO$_2$/silicon nitride film, SiN/silicon oxide film, SiO$_2$) is formed so as to cover the floating gate 5. And a polycrystalline silicon film (100 to 200 nm) is formed as an electrode of a control gate 7 above the floating gate with the ONO film sandwiched therebetween. A source 8 and a drain 9 are formed in self-alignment with the electrodes of the gate 5 and 7.

Figure 2:
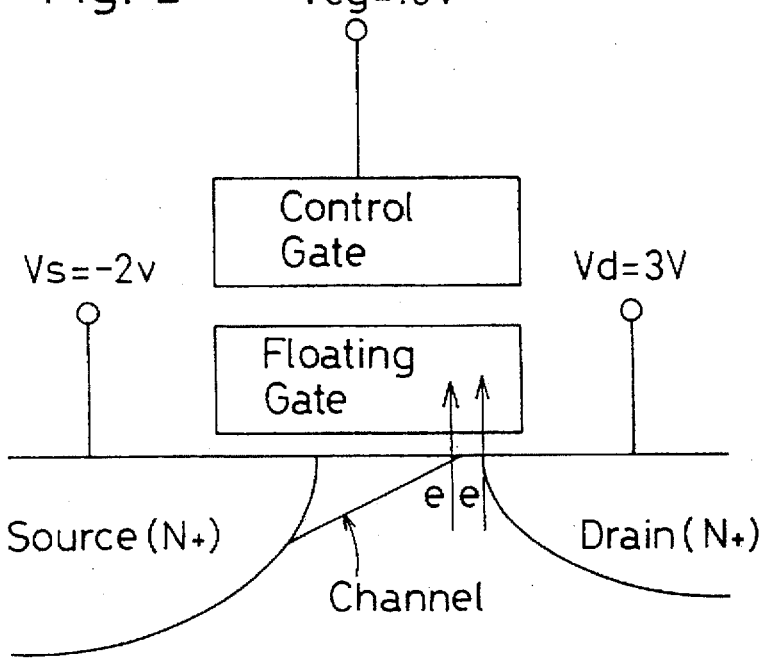
FIG. 2 illustrates the principle for writing a memory cell in accordance with the present invention.

FIG. 2 illustrates the principle for writing a memory cell in accordance with one embodiment of the present invention. As shown in FIG. 2, in a cell selected to be written, when a negative bias of −2 V is applied to the P-well and the source, Vpw=Vs=−2 V, Vcg=10 V to the control gate and Vd=3 V to the drain, electrons are injected into the floating gate by CHE injection and the writing of the cell is accomplished.

Figure 3A:
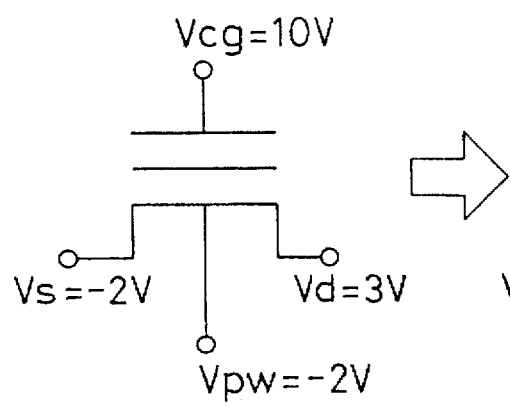
FIGS. 3A and 3B illustrate voltages applied in a writing operation in accordance with the present invention.
Figure 3B:
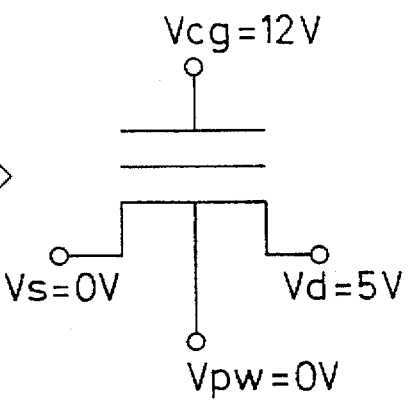

FIGS. 3A and 3B are schematic views showing voltages applied in the writing operation of the memory cell. As shown in FIG. 3A, the voltages applied in writing a memory cell of the present invention are 2 V lower than those in FIG. 3B, while at the same time the equivalent writing to the conventional method is secured. However the difference of voltage (Vcg voltage difference) of a decoder (not shown in the figure) to a word line WL is only from 0 to 10 V. Therefore, the negative bias applied to the P-well allows the reduction of the voltage Vcg in the writing operation.

FIGS. 4A and 4B illustrate the principle for erasing a memory cell of the present invention, FIG. 4A illustrating the source-gate erasing (the negative bias method) and FIG. 4B illustrating the substrate erasing (the channel erasing method).

As described in the paragraphs for explaining the conventional references, the source-gate erasing was the most suitable for the reduction of voltage Vcg to the control gate.

However, in the present invention, both the above two erasing methods are effective for the reduction of the voltages to be applied. Due to the dual-well structure of the present invention, a positive voltage can be applied to the P-well electrically separately from the P-substrate. Therefore the reduction of Vcg (−10 V) can be achieved, as shown in FIG. 4B, by controlling F-N tunnel current by thinning the tunnel oxide and ONO films also in the substrate erasing method (the channel erasing). The effective erasing method is not limited to the above two erasing methods in the present invention.

The reduction of the voltage Vcg to be applied to the control gate in the writing and erasing operations enables the microminiaturizing of peripheral circuits, the reduction of chip area and the reduction of production costs per chip.

FIG. 5 is a explanatory table for voltages applied to each part of the memory cell array of the present invention in the writing, erasing and reading operations. In FIG. 5, the reference characters WL, BL, SL and PW denote a word line connected to the control gate, a bit line connected to the drain, a source line connected to the source and the Pwell respectively.

Further in FIG. 5, columns of the selected WL, nonselected WL, selected BL and non-selected BL denote voltages applied to a word line connected to the control gate of the selected memory cell, the word line connected to the control gate of the non-selected memory cell, the bit line connected to the drain of the selected memory cell and the bit line connected to the drain of the non-selected memory cell respectively in the memory cell array.

Figure 6B:
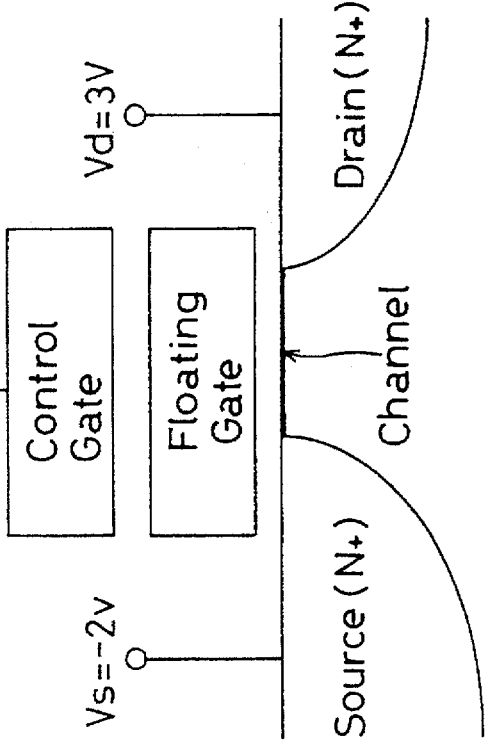
FIGS. 6A and 6B illustrate the principle for rewriting a non-selected cell in accordance with the present invention.
Figure 6A:
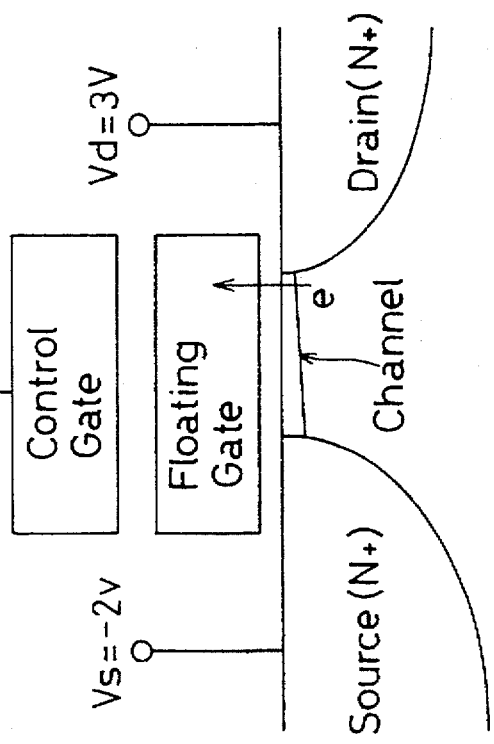
Figure 7A:
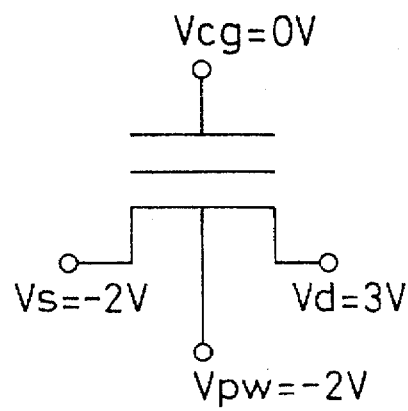
FIGS. 7A and 7B illustrates voltage applied in a rewriting operation of a non-selected cell in accordance with the present invention.
Figure 7B:
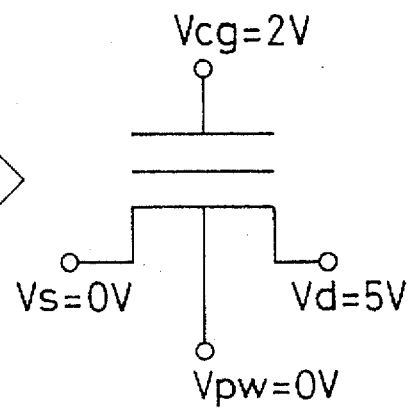

FIG. 6A and 6B illustrate the principle for rewriting a non-selected memory cell in accordance with the present invention, FIG. 6A for rewriting an over-erased non-selected cell, and FIG. 7A and 7B are schematic views showing voltages applied in the rewriting of a non-selected cell. In the writing operation, the voltage Vpw=Vs=−2 V is applied to the P-well and the source, Vcg=0 V is applied to the control gate and Vd=3 V is applied to the drain of the non-selected memory cell.

The voltage of Vcg=0 V applied to the control gate of a non-selected cell as shown in FIG. 7A is equivalent in practical effect to a positive voltage of Vcg=2 V as shown in FIG. 7B. Therefore, as shown in FIG. 6A, a channel is induced and the weak writing (rewriting to some extent) occurs in a non-selected cell in which Vth is lower than 2 V.

Additionally, FIG. 6B illustrates a case of a non-selected cell of Vthmax>3 V. In the non-selected cell in which Vthmax is 3 V or higher, no channel is induced and therefore no weak writing occurs. Thus, when the non-selected cell is over-erased (Vth<0 V), the cell is rewritten into the state in which Vth is from 0 V to 2 V. Moreover, since no channel is induced, that is, no rewriting occurs, in a cell in which Vth is 2 V or higher, never does any mis-writing occur which makes a normally erased cell to have a threshold voltage which is Vthmax (3 V) or higher.

Figure 8:
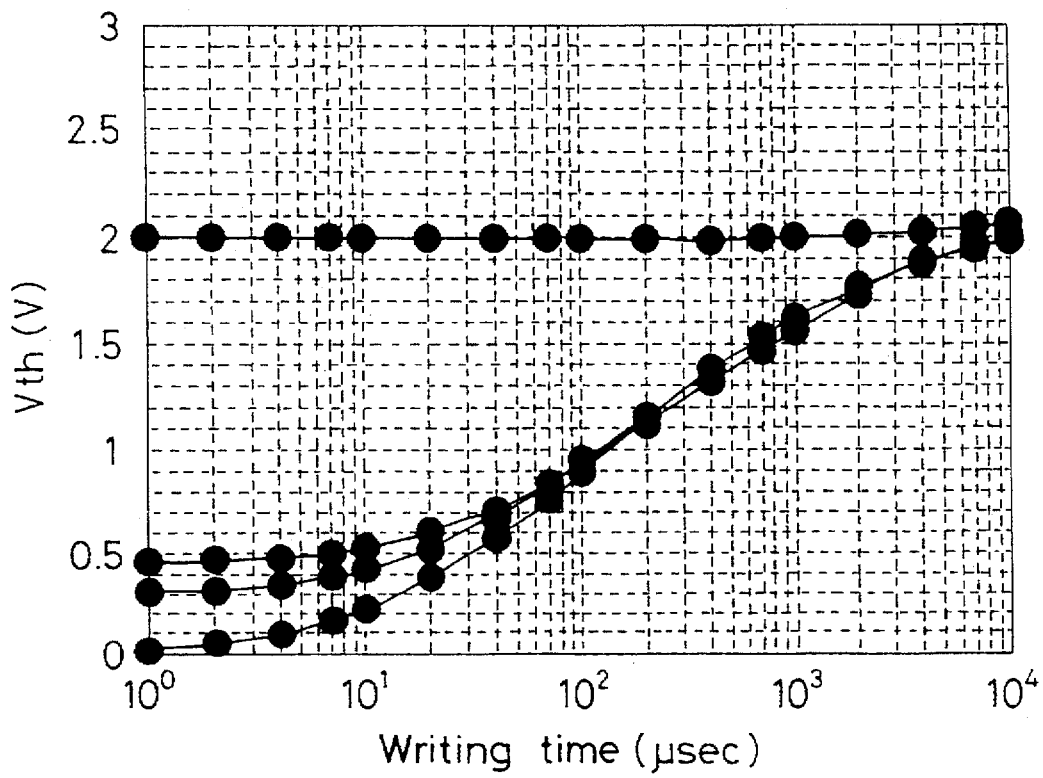
FIG. 8 is a graph showing characteristics in rewriting over-erased cells of the present invention.

That is, when the over-erased cell is not selected, the cell changes from the over-erased state into the normally erased state while the selected cell is being written (see FIG. 8).

FIG. 8 is a graph explaining rewriting characteristics to over-erased cells in accordance with the present invention, showing changes in the threshold voltages Vth of over-erased cells which are not selected to be written (Vcg=0 V, Vpw=Vs=−2 V, Vd=3 V). The control gates thereof are practically supplied with a weak positive potential (about 2 V) by operating the writing of the selected cells, the threshold voltage Vth thereof recovering 2 V as the writing time passes.

The writing test of the memory cells of the invention shows that, for example in a memory cell in which the Vth was 0 V, the Vth recovered 0.5 V in 30 usec. and 1 V in 200 usec. and the over-erased cell converged to about 2 V in 10 msec. when the writing of all the cells were completed. Thus, the threshold voltages of all the over-erased cells are repaired to the normally erased states during the writing operation of all the cells.

Next the writing operation will be hereafter described in a case that about 3 V is set for the maximum threshold voltage Vthmax permissible for a threshold voltage after the erasing of the memory cell in accordance with an embodiment of the present invention.

Figure 9A:
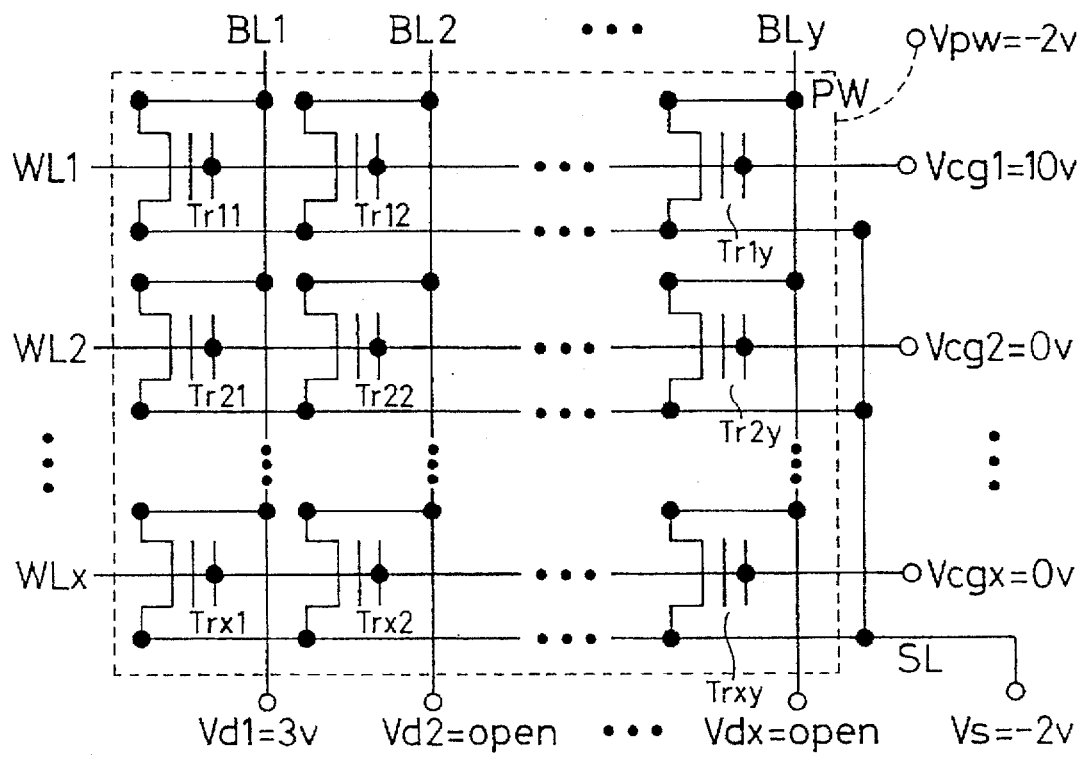
FIGS. 9A and 9B is a circuit diagram illustrating a writing operation of a memory cell array in accordance with the present invention.
Figure 9B:
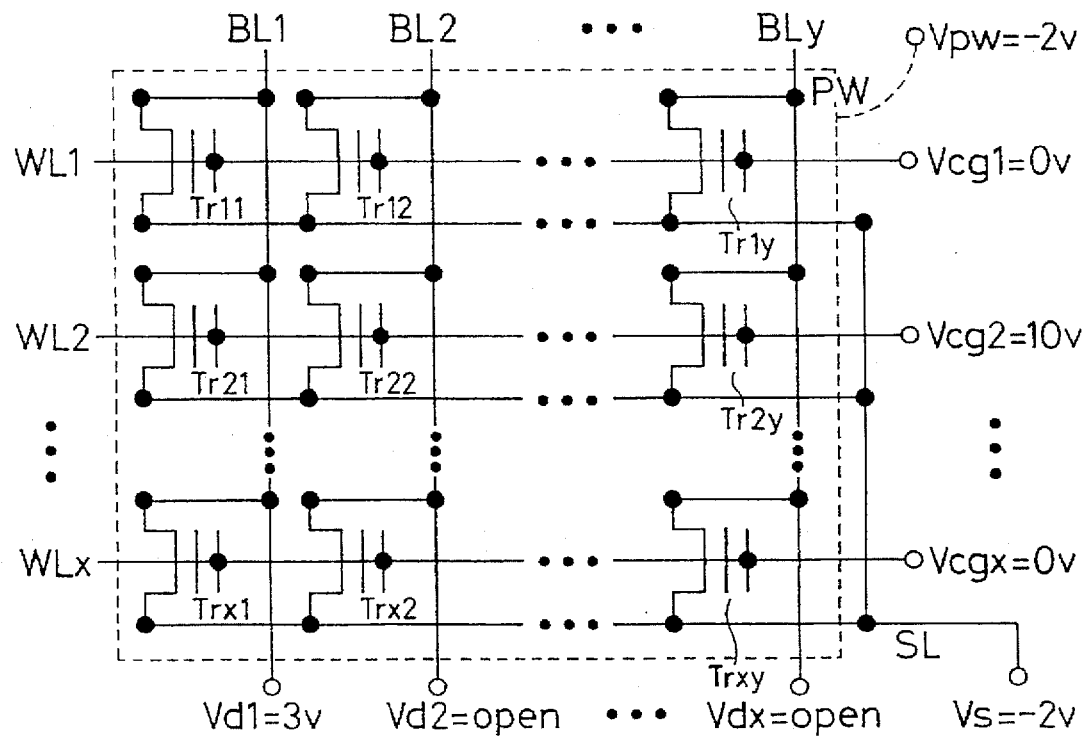
Figure 11:
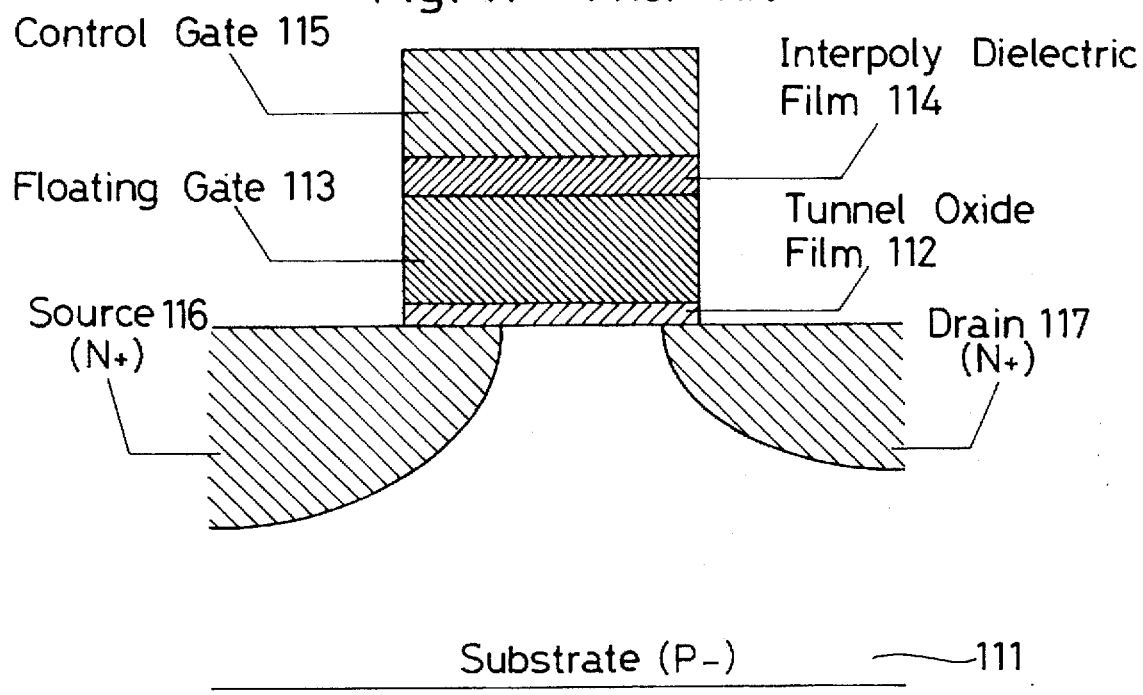
FIG. 11 is a sectional view illustrating the construction of a nonvolatile semiconductor memory in accordance with the conventional reference 1.
Figure 12:
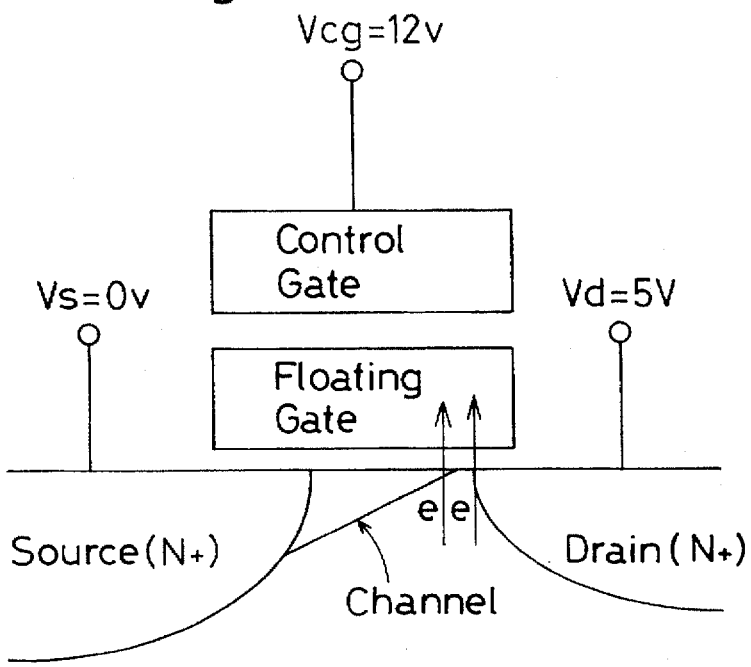
FIG. 12 illustrates the principle for writing a memory cell in accordance with the conventional reference 1.
Figure 13A:
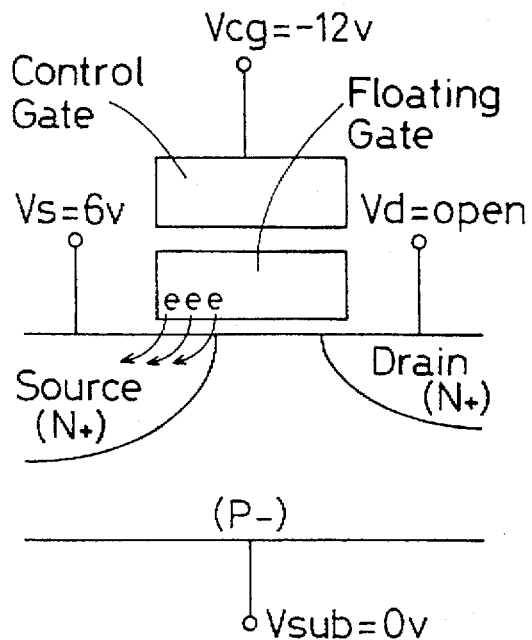
FIGS. 13A to 13C illustrate voltages applied to a memory cell in accordance with the conventional reference 1.
Figure 13B:
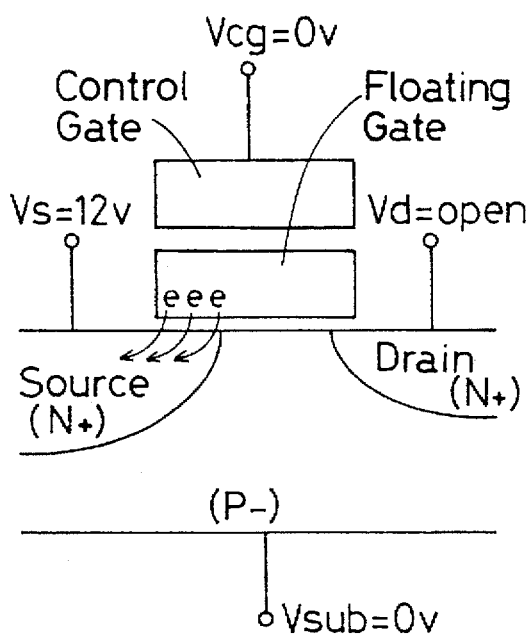
Figure 13C:
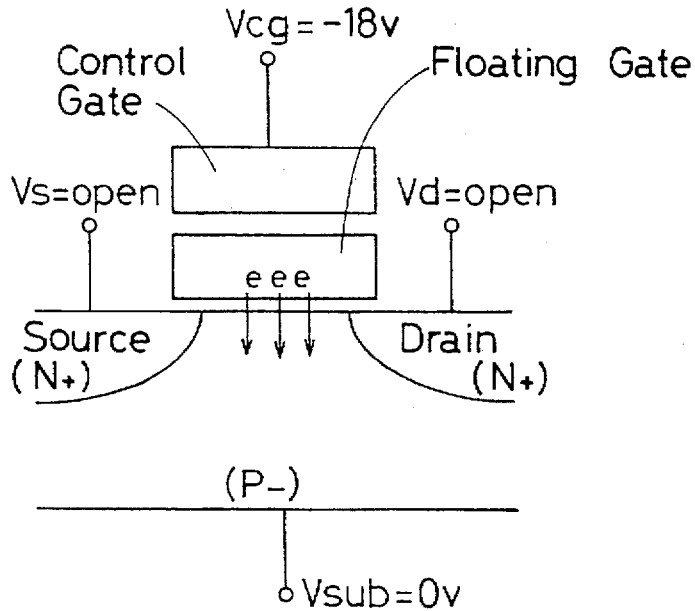
Figure 14:
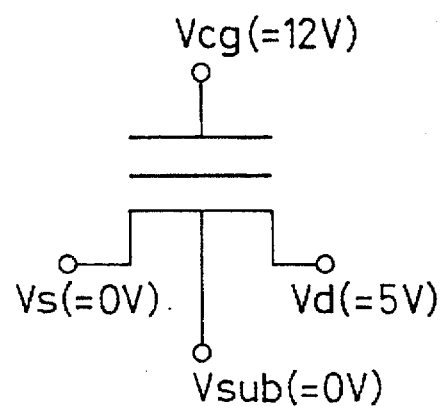
FIG. 14 illustrates the principle for erasing a memory cell in accordance with the conventional reference 1.
Figure 15:
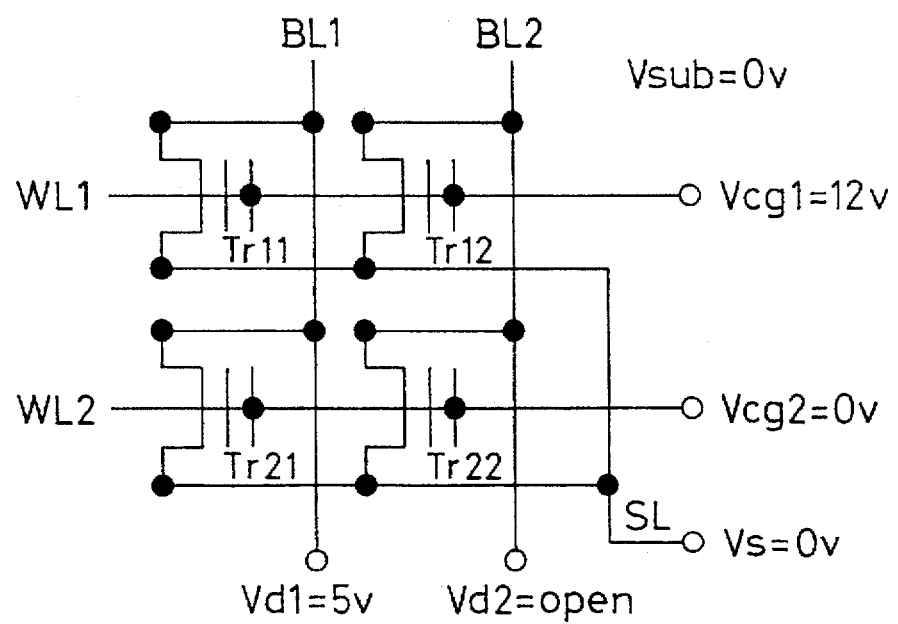
FIG. 15 is a circuit diagram illustrating a writing operation of a memory cell array in accordance with the conventional reference 1.
Figure 16:
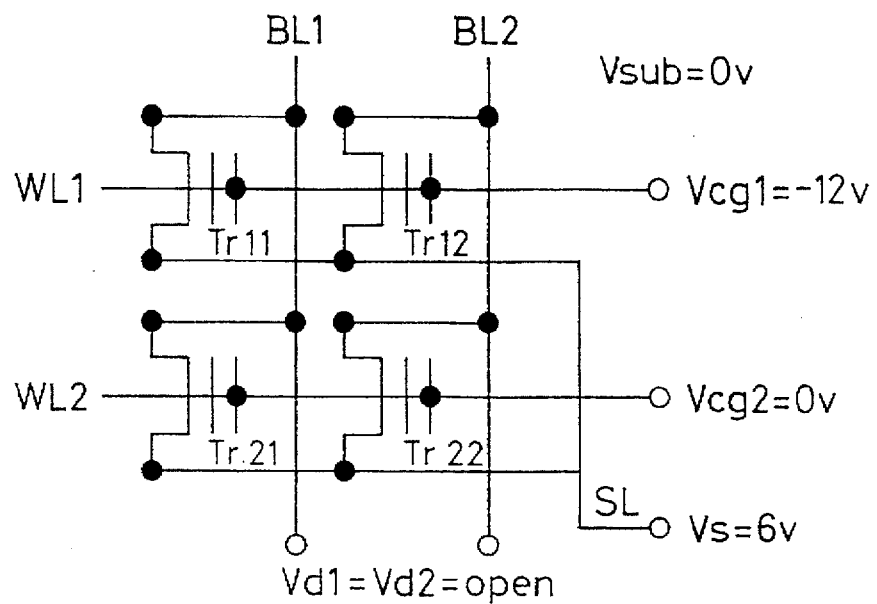
FIG. 16 is a circuit diagram illustrating an erasing operation of a memory cell array in accordance with the conventional reference 1.
Figure 18:
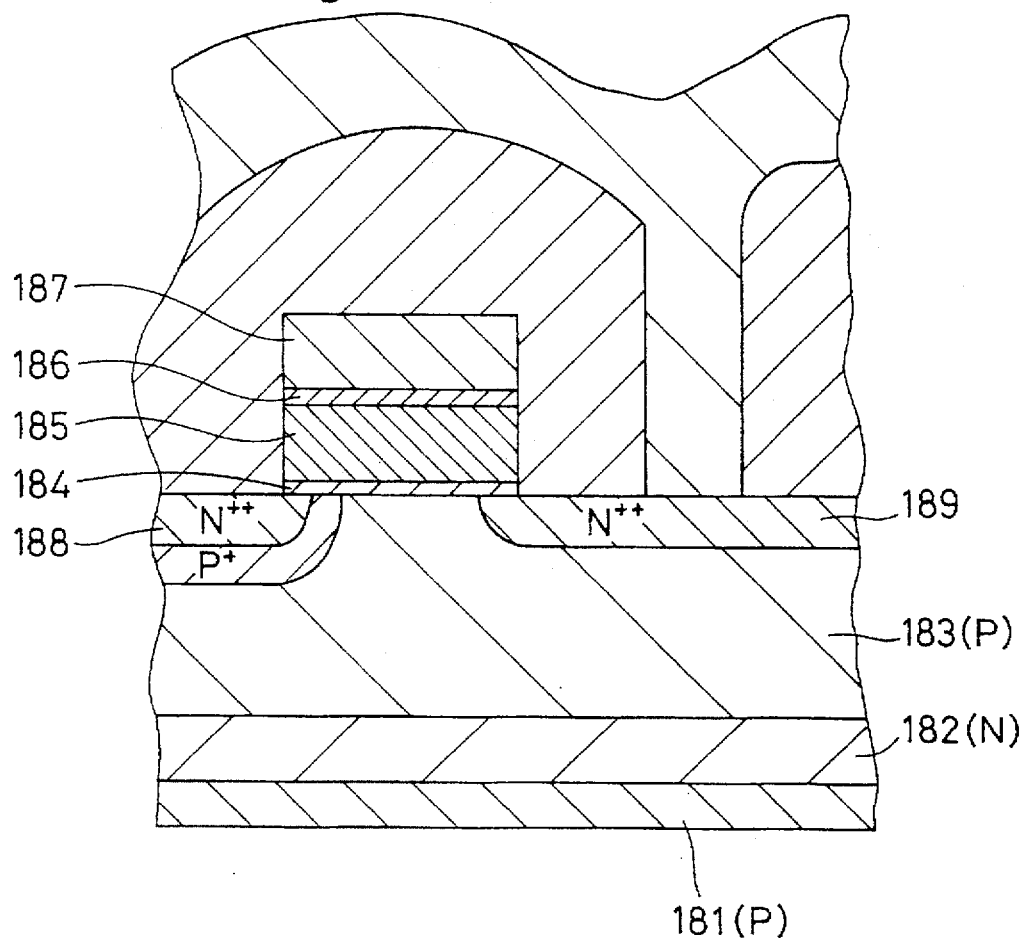
FIG. 18 is a sectional view illustrating a construction of a nonvolatile semiconductor memory in accordance with the conventional reference 2.
Figure 20:
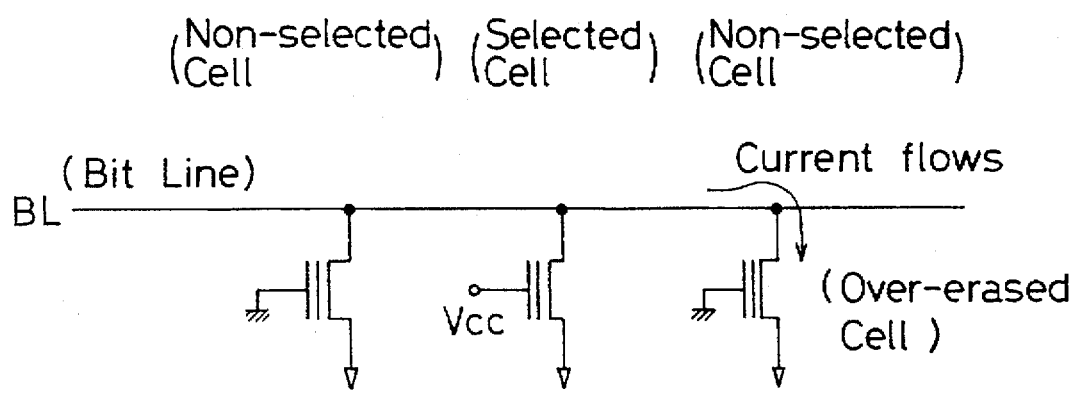
FIG. 20 illustrates a misreading of a memory cell in accordance with the conventional reference 1.

FIG. 9A and 9B are circuit diagrams illustrating a writing operation of a memory cell array of the present invention, FIG. 9A showing the writing of a memory cell Tr11 and FIG. 9B showing that of a memory cell Tr21.

In FIGS. 9A and 9B, each of the reference characters Tr11, Tr12 to Trxy denotes a memory cell with a floating gate, each of WL1 to WLx denotes a word line, each of BL1 to BLy denotes a bit line and the SL denotes a source line. The word line WL1 is connected to the control gates of Tr11 to Tr1y and the word line WL2 is connected to the control gates of Tr21 to Tr2y. The bit line BL1 is connected to the drains of Tr11 to Trx1 and the bit line BL2 is connected to the drains of Tr12 to Trx2. The source line SL is connected to the sources of Tr12 to Trxy.

As shown in FIG. 9A and FIG. 5, the P-substrate and the N-well are grounded and a negative voltage is applied to the P-type second well PW and the source line SL, Vpw=Vs= about −2 V. A positive first voltage Vd (about 3 V) is applied to an optionally selected bit line BL1, without stepping up the power supply voltage and the non-selected bit lines BL2 to BLx are kept open.

Then, by applying either a positive second voltage Vcg= 10 V or 0 V to the selected word line WL1, it is determined whether the selected Tr11 is written or not.

Further, the non-selected word lines WL2 to WLx are fixed at 0 V. In the memory cells Tr21 to Trx1 defined by the bit line BL1 to which the positive first voltage Vd1 is applied and the word lines WL2 to WLx fixed at 0 V, the control gates thereof practically have a weak positive potential (about 2 V), which writes weakly over-erased cells (Vth<0) out of the memory cells Tr21 to Trx1. Thus the over-erased cells can be rewritten.

Next, it will be described how all the over-erased cells in the memory cell array are rewritten at the same time the writing is being operated. After the writing operation of Tr11 shown in FIG. 9A, the writing operation of Tr21 is done as shown in FIG. 9B. Keeping the voltages applied to the P-type substrate, the P-type second well, the sources of the memory cells and the bit lines as they are in FIG. 9A, the writing of the selected memory cell Tr21 is operated by applying either about Vcg=10 V or 0 V to the selected WL2. In this case, the word lines WL1 and WL3 to WLx other than XL2 are also fixed at 0 V.

Out of the non-selected cells Tr11, Tr31 to Trx1 on the selected bit line, the cells in which Vth is lower than 2 V are weakly written, and the cells in which Vth is higher than 2 V are not written, the mis-writing never occurring.

As described above, either 10 V or 0 V is applied to each of the word lines WL3 to WLx in turn so as to select Tr11 to Trx1 in turn. Out of the memory cells Tr11 to Trx1, the cells to which 0 V is applied via the connected word line practically have a weak positive potential (about 2 V), which makes induced channels in over-erased cells out of Tr21 to Trx1 and makes the over-erased cells rewritten by the weak writing. Additionally, the source of the memory cell array may be separately constructed per block unit and a negative voltage Vs=−2 V is applied thereto with the same effect.

By utilizing the above described weak writing operation, no circuit for rewriting is required, which makes the peripheral circuits less complicated.

Further by utilizing the above described weak writing operation, the rewriting of the over-erased cells on the selected bit line is operated at the same time as the writing of the memory cells on the bit line. That is, an additional operation for rewriting the over-erased cells is not required, which shortens the operational time.

FIG. 10 is a time chart illustrating the applied voltages on a selected bit line. Referring to FIG. 10, the time during which each bit line is selected (Vd is applied) is supposed to be the same regardless of the number of memory cells to be written and also sufficient for the rewriting. For example, supposing the time necessary for the rewriting is 5 msec, the time Tb shown in FIG. 10 should be 5 msec and the writing is controlled to be completed in the period. When memory cells are connected to a bit line and the time Tw necessary for writing the cells is for example about 10 usec., 10 usec. is set for selecting each WL no matter which voltage is applied to the WLx, 10 V or 0 V.

When Tr22 is not rewritten, 0 V is always applied to WL2 as shown in FIGS. 9A, 9B and 10. When Tr22 is an over-erased cell, Tr22 is rewritten since Vd (3 V) is kept applied to BL, Vs (−2 V) to the source, Vpw (−2 V) to the P-well and 0 V to the control gate for the time Tb.

The control of selecting the word lines WL can be done in various ways, not only by selecting each in turn as shown in the figure, but also by selecting word lines WL in such a manner that the selecting times are overlapped, by selecting a plurality of word lines WL at the same time, and the like. The time Tb is suitably controlled to be the same per bit line, but not to vary for each bit line depending on the number of memory cells to be written.

Such a rewriting can be operated effectively by selecting the word lines WL after the voltage is applied to the bit line BL.

When a memory cell of the present invention is run by 3 V power supply voltage, an additional step-up transformer circuit for supplying the voltage for the drain as well as a circuit for generating and supplying negative voltage are required besides a step-up transformer circuit for supplying the control gate with voltage if the voltage applied to the P-well and the source is 0 to −2 V; whereas when the voltage applied to the p-well and the source is a negative voltage of about −2 V, i.e. Vs=Vpw=about −2 V, the drain voltage Vd can be about 3 V without changing the potential difference of about 5 V between the source and the drain in the writing operation. Thus the drain is directly supplied with the power supply voltage without a step-up transformer, which means that no additional circuit for supplying the drain with voltage is necessary any longer.

According to the present invention, by applying a negative voltage to the P-well and the source of a memory cell, the difference of voltages Vcg applied to the control gate is reduced below the voltage necessary for the writing between the source and the control gate. This reduction of the voltage applied to the control gate, Vcg, enables the microminiaturization of peripheral circuits, the reduction of chip area and the reduction of production costs per chip.

Also, according to the present invention, by rewriting over-erased cells (recovering the threshold voltage, Vth) by using the weak writing during the writing operation, the circuit (peripheral circuit) for repairing over-erased cells into the normally erased cells can be omitted, which leads to the simplification of peripheral circuits.

Also, because the rewriting (the weak writing) of the over-erased cells on a selected bit line can be operated at the same time as the writing of memory cells on the selected bit line, no additional operation of rewriting the over-erased cells is needed, which shortens the operational time for rewriting.

Furthermore, because the voltage applied to the selected bit line can be reduced while the potential difference between the source and the drain is kept the same as in the conventional method by applying a negative voltage to the P-well and the source, the bit line can be directly supplied with the power supply voltage without stepping up the voltage. As a result, a step-up transformer circuit for obtaining the voltage to be applied to the bit line is not required and the complication of peripheral circuits can be avoided by replacing a step-up transformer circuit with a generating circuit for supplying negative voltage for the P-well and the source of the memory cell.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for writing in a non-volatile semiconductor memory which includes: a plurality of memory cells, each having a source and a drain which are N-type regions formed in a P-well on a semiconductor substrate with a floating gate formed on the P-well with a tunnel oxide film therebetween and a control gate formed on the floating gate with an interpoly dielectric film therebetween, a plurality of bit lines, a plurality of word lines and a source line, the source of each memory cell being connected to the source line, the drain of each memory cell being connected to one of the bit lines, the control gate of each memory cell being connected to one of the word lines, the memory cell being written, erased or read by selectively supplying suitable voltages to the source, bit and word lines connected thereto, comprising:

writing to a selected memory cell by injecting electrons into the floating gate thereof by a channel hot electron method including applying a negative voltage to the P-well and the source line, a first positive voltage to the selected bit line, a second positive voltage to the selected word line, and a zero voltage to a non-selected word line;

opening a non-selected bit line so that no voltage is applied while the selected memory cell is being written; and recovering a non-selected, over-erased cell connected to the selected bit line by weak writing the non-selected, over-erased cell to increase a threshold voltage associated with the non-selected, over-erased cell.

2. A method for writing in a nonvolatile semiconductor memory according to claim 1 wherein the selected memory cell is written by injecting electrons into the floating gate by a CHE injection method with the first positive voltage applied to the bit line connected to the selected memory cell being lower than a power supply voltage applied to the device.

3. A method for writing in a nonvolatile semiconductor memory according to claim 1 wherein the selected memory cell is written by injecting electrons into the floating gate by a CHE injection method with an absolute value of the negative voltage applied to the P-type well and the source being smaller than that of a maximum threshold voltage of a memory cell in an erased state.

4. A method for writing in a nonvolatile semiconductor memory according to claim 1 wherein the selected memory cell is written by injecting electrons into a floating gate by a CHE injection method with other memory cells on a bit line being selected in turn and written with a binary "1" or "0" while the negative voltage is applied to the P-type well and the source line and the first positive voltage is applied to the selected bit line.

5. A method for writing in a non-volatile semiconductor memory according to claim 1 wherein the selected memory cell is written by injecting electrons into the floating gate by a CHE injection method the negative voltage applied to the P-type well and the source line is about −2 V, the first positive voltage applied to the selected bit line is about 3 V, and the second positive voltage applied to the selected word line is about 10 V.

6. A method for writing in a non-volatile semiconductor memory according to claim 1 wherein the weak writing includes writing a logical "0" into the non-selected, over-erased cell.

7. A method for writing in a non-volatile semiconductor memory according to claim 1 wherein the weak writing includes applying a zero voltage to the word line connected to the non-selected, over-erased cell.

8. A method for writing in a non-volatile semiconductor memory according to claim 1, further comprising:

recovering a plurality of non-selected, over-erased cells connected to the selected bit line by weak writing to the non-selected, over-erased cells.

* * * * *